(12) United States Patent
Smith et al.

(10) Patent No.: US 9,410,263 B2
(45) Date of Patent: Aug. 9, 2016

(54) FZ SEED HOLDER AND PRE-HEATER

(71) Applicants: Mitsubishi Polycrystalline Silicon America Corporation (MIPSA), Theodore, AL (US); MITSUBISHI MATERIALS CORPORATION, Tokyo (JP)

(72) Inventors: Brian P. Smith, Theodore, AL (US); Christopher Cook, Theodore, AL (US)

(73) Assignee: Mitsubishi Polycrystalline Silicon America Corporation (MIPSA), Theodore, AL (US)

( * ) Notice: Subject to any disclaimer, the term of this patent is extended or adjusted under 35 U.S.C. 154(b) by 533 days.

(21) Appl. No.: 13/837,047

(22) Filed: Mar. 15, 2013

(65) Prior Publication Data

US 2014/0261160 A1 Sep. 18, 2014

(51) Int. Cl.
*C30B 13/00* (2006.01)
*C30B 13/28* (2006.01)

(52) U.S. Cl.
CPC .............. *C30B 13/285* (2013.01); *Y10S 117/911* (2013.01); *Y10T 117/1076* (2015.01)

(58) Field of Classification Search
CPC ............ Y10T 117/1076; C30B 13/285; Y10S 117/911
See application file for complete search history.

(56) References Cited

U.S. PATENT DOCUMENTS 5,935,321 A * 8/1999 Chiou et al. ..................... 117/13
2009/0158996 A1 * 6/2009 Chikusa et al. ............... 117/216

* cited by examiner

*Primary Examiner* — Robert M Kunemund
*Assistant Examiner* — Hua Qi
(74) *Attorney, Agent, or Firm* — Locke Lord LLP

(57) ABSTRACT

The device of according to the present invention is a device for holding a single crystal silicon seed. The device or holder contains a plurality of strips to clamp a seed crystal in the seed crystal holder; and a base supporting the plurality of strips. The plurality of strips each has a free end which contacts a single crystal silicon seed and an end opposite the free end which joins the base and becomes integral therewith. The plurality of strips are bent or folded in such that they exert pressure on a seed crystal when the seed crystal is inserted among the plurality of strips.

9 Claims, 6 Drawing Sheets

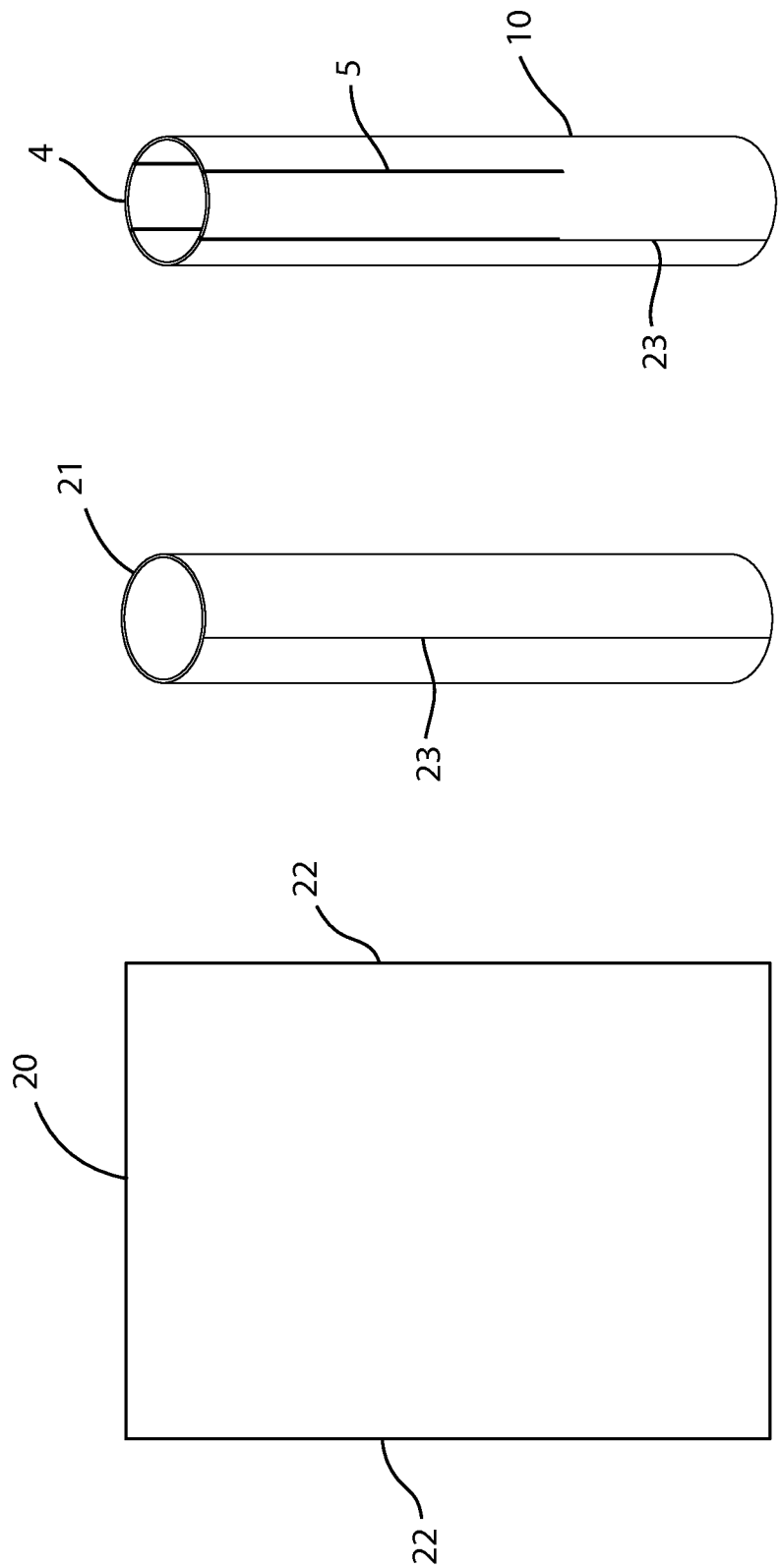

FZ SEED HOLDER AND PRE-HEATER

BACKGROUND OF THE INVENTION

1. Field of the Invention

The present invention relates to seed crystal holder providing a space for a seed crystal to rest which will prevent the seed crystal from tipping over and also serves as a pre-heater for the seed crystal. The seed crystal holder is typically used in an apparatus for producing single crystal silicon, and specifically, in an apparatus for producing single crystal silicon in which the single crystal is grown using the FZ (float zone) method.

2. Description of Related Art

The apparatus disclosed in Japanese Patent Application, First Publication No. Hei 7-10681 is a conventionally known example of an apparatus for producing single crystal silicon in which the FZ method is employed. This apparatus for producing single crystal silicon is provided with a housing which has an inert gas environment internally; a polycrystal holder that is installed to an upper drive shaft (positioning rod) inside the housing, and which holds at its bottom end a polycrystalline silicon rod that is the sample material; a seed crystal holder that is installed to a lower drive shaft (positioning rod), and which holds at its top end a seed crystal for the silicon single crystal; and a high-frequency induction heating coil that is provided at a central area inside the housing. In this apparatus for producing single crystal silicon, the polycrystalline silicon rod which is the starting material is held by the polycrystal holder above and the seed crystal for the silicon single crystal is held by the seed crystal holder. With this arrangement in place, the high-frequency induction heating coil is then employed to melt and fuse one end of the polycrystalline silicon to the seed crystal. Thereafter, the polycrystalline silicon rod is rotated relative to the high-frequency induction heating coil and undergoes relative displacement in the axial direction. A single crystal silicon rod is thereby produced by sequential zone melting of the polycrystalline silicon rod in the axial direction.

This apparatus for producing single crystal silicon is provided with a high-frequency induction heating coil for heating the polycrystalline silicon rod. Because the polycrystalline silicon rod has a high specific resistance when it is cold, an exothermic ring (susceptor) comprising carbon, etc., is provided for preheating the polycrystalline silicon in an initial step by radiant heat. First, this exothermic ring undergoes induction heating to reach a high-temperature state. The polycrystalline silicon rod is then heated using this radiant heat. After the temperature of the polycrystalline silicon rod increases to reach a state that enables transmission of electricity, the polycrystalline silicon releases heat on its own as a result of this induction heating. Once this state has been reached, the exothermic ring is receded from around the polycrystalline silicon rod. Thereafter, the polycrystalline silicon rod subject to direct induction heating, and the bottom end thereof melts. This molten bottom end is then fused to the seed crystal, and the single crystal thus grows. The single crystal is releasably retained in the seed crystal holder so when the single crystal is completed, it can be easily separated from the seed crystal holder for further processing.

Known seed crystal holders typically consist of a cylindrical chuck with an open end for receiving a seed crystal and a plurality of set screws for securing, by tightening, the seed crystal in the seed crystal holder. Sometimes an additional ring is added around the portion of the seed crystal protruding from the seed crystal holder as a preheater. Typically both the seed crystal holder and preheating ring are made of tantalum. Heating times for heating the seed crystal using known seed crystal holders and preheating rings are about 5-6 minutes using a high-frequency induction heating coil, also known as a RF coil.

SUMMARY OF THE INVENTION

Several objects and features of the present invention may be noted for a seed crystal holder for supporting a single crystal during growth of the crystal that overcomes at least the following problems: a seed crystal holder that does not require changing current equipment for its use; a holder that does not increase the cost of producing single crystals; a holder that is simple for an operator to use; and a holder that improves manufacturing efficiency.

Another object of the invention is to provide seed crystal holders that pre-heat the seed crystals.

A further object of the invention is to pre-heat the seed crystals using the seed crystal holder without the addition of additional external warming devices.

A still further object of the invention is to provide seed crystal holders that provide direct contact with a non-melt zone area of the seed which provides quicker heat transfer to the single crystal seed.

An even further object of the invention is to provide a more pliable seed crystal holder which can adjust to different sizes of seed crystals.

An additional object of the invention is to provide an improved method of growing seed crystals.

The method of pre-heating the seed crystal during a growth process includes supporting the seed crystal in a seed crystal holder of the present invention for growing the seed crystal and preventing the seed crystal from falling over; and pre-heating the seed crystal supported in the seed crystal holder by using heat radiating from the RF coil.

The seed crystal holder according to the present invention is a device for holding a single crystal silicon seed. The device comprises: a plurality of strips to clamp a seed crystal in the seed crystal holder; and a base supporting the plurality of strips. The plurality of strips each has a free end which contacts a single crystal silicon seed and an end opposite the free end which joins the base and becomes integral therewith. The plurality of strips are bent or folded such that they exert pressure on a seed crystal when the seed crystal is inserted among the plurality of strips. The seed crystal will typically be inserted from the free end of the plurality of strips and can reach to the base supporting the plurality of strips. When a seed crystal is inserted among the plurality of strips, the strips will deform outwards away from the center of the seed crystal holder and the strips are resilient to maintain pressure on the seed crystal to clamp and to secure the seed crystal in the seed crystal holder.

The seed crystal holder can be made from tantalum metal and the strips are of a design and thickness such that they maintain pressure on the seed crystal holder inserted therein.

A float zone apparatus of the invention contains a crystal growth chamber; a seed crystal holder further containing: a plurality of strips to clamp a seed crystal in the seed crystal holder; and a base supporting the plurality of strips; a polycrystal holder that holds a polycrystalline silicon rod; an induction heating coil; and a rotating device for rotating the seed crystal holder and polycrystal holder.

Other aspects and advantages of the invention will become apparent from the following detailed description, which taken in conjunction with the drawings, disclosed preferred embodiments of the invention.

BRIEF DESCRIPTION OF THE DRAWINGS

FIG. 2 is a view showing the seed crystal holder material in a flattened shape before it is made into the shape shown in FIG. 1;

FIG. 3 is a perspective view showing the seed crystal holder material rolled into a cylinder shape;

FIG. 4 is a perspective view showing the seed crystal holder in a cylinder shape and cut to have a plurality of incisions extending from one end of the cylinder and stopping before the other end of the cylinder forming a plurality of strips between the incisions;

DETAILED DESCRIPTION OF THE INVENTION

Typically a FZ apparatus is used for producing single crystal silicon. The FZ apparatus has a chamber which is filled with an inert gas, like argon gas. An upper drive shaft is provided in the center of a top wall of the chamber for rotational driving and reciprocated driving in the vertical direction. In addition, a lower drive shaft is provided to a bottom of the chamber opposite the upper drive shaft and so as to be on the same axis, for rotational driving and reciprocated driving in the vertical direction. A polycrystal holder for holding a polycrystalline silicon rod which is the sample material via a hoist consisting of molybdem wire is provided to a bottom end of the upper drive shaft. A seed crystal holder 1 for holding a seed crystal 24 (FIG. 8) for the silicon single crystal is provided at a top end of the lower drive shaft.

A high-frequency induction heating coil and a quartz-coated exothermic ring are typically provided in between the polycrystal holder and the seed crystal holder 1 inside the chamber. The high-frequency induction heating coil is typically formed so that its overall shape is that of a discoid ring, and is held horizontally by a support rod which is supported on a side wall of the chamber. The exothermic ring comprises a conductive member comprising carbon, and a quartz-coated member which covers the conductive member with an interval of space there between.

Figure 9:
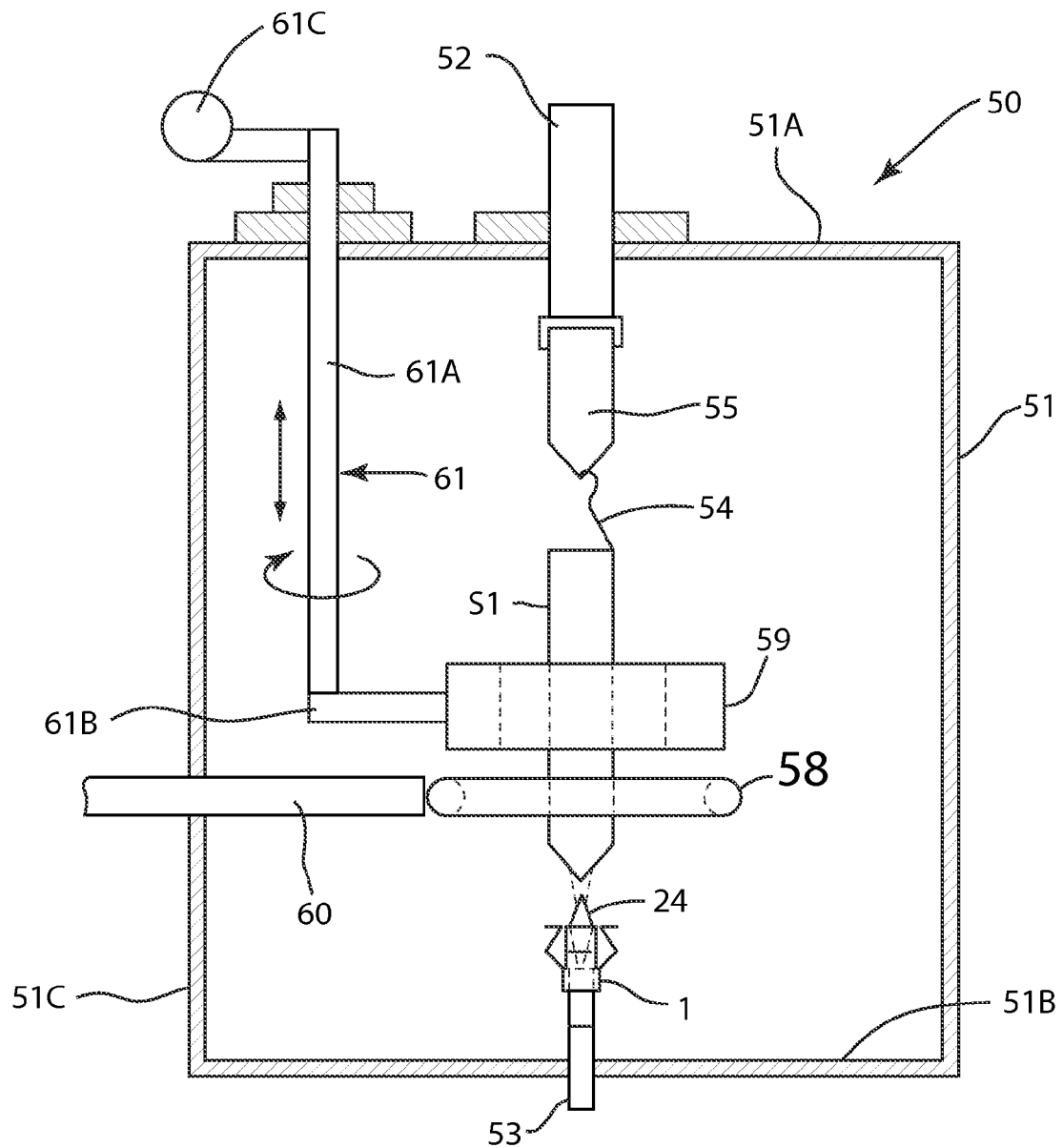
FIG. 9 is a schematic structural view of an apparatus for producing single crystal silicon according to the invention.

FIG. 9 is a schematic structural view of an apparatus 50 for producing single crystal silicon according to the invention. In the figure, numeric symbol 51 indicates a housing which is filled with an inert gas (argon gas). An upper drive shaft 52 is provided in the center of the top wall 51A of this housing for rotational driving and reciprocated driving in the vertical direction. In addition, a lower drive shaft 53 is provided to the bottom 51B of the housing 51 opposite the upper drive shaft 52 and so as to be on the same axis, for rotational driving and reciprocated driving in the vertical direction. A polycrystal holder 55 for holding the polycrystalline silicon rod S1 which is the sample material via a hoist 54 consisting of molybdem wire is provided to the bottom end of the upper drive shaft 52. A seed crystal holder 1 for holding the seed crystal 24 for the silicon single crystal is provided at the top end of the lower drive shaft 53.

A high-frequency induction heating coil 58 and a quartz-coated exothermic ring 59 are provided in between the polycrystal holder 55 and the seed crystal holder 1 inside the housing 51. The high-frequency induction heating coil 58 is formed so that its overall shape is that of a discoid ring, and is held horizontally by a support rod 60 which is supported on a side wall 51C of the housing 51. The exothermic ring 59 has overall shape of a ring.

This exothermic ring 59 is held horizontally at a position above the high-frequency induction heating coil 58 by a support member 61 which hangs downward from the top wall 51A of the housing 51. This support member 61 is formed in the shape of the letter L by a vertical part 61A and a horizontal part 61B. The top end of the vertical part 61A passes through the top wall 51A of the housing 51 and is supported on top wall 51A to permit rotation, raising and lowering. The exothermic ring 59 is fixed in place to the front end of the horizontal part 61B which is combined with the bottom end of the vertical part 61A. An operating device 61C, such as a lever or the like, is provided at the top end of the vertical part 61A which projects out from the top wall 51A of the housing 51. By manipulating the operating device 61C, the exothermic ring 59 held at the bottom end thereof can be moved slightly up or down, and can be subjected to reciprocating movement between a "heating position", which is disposed to the space between the polycrystal holder 55 and the seed crystal holder 1, and a "stand-by position" which is removed laterally from this space.

Figure 1:
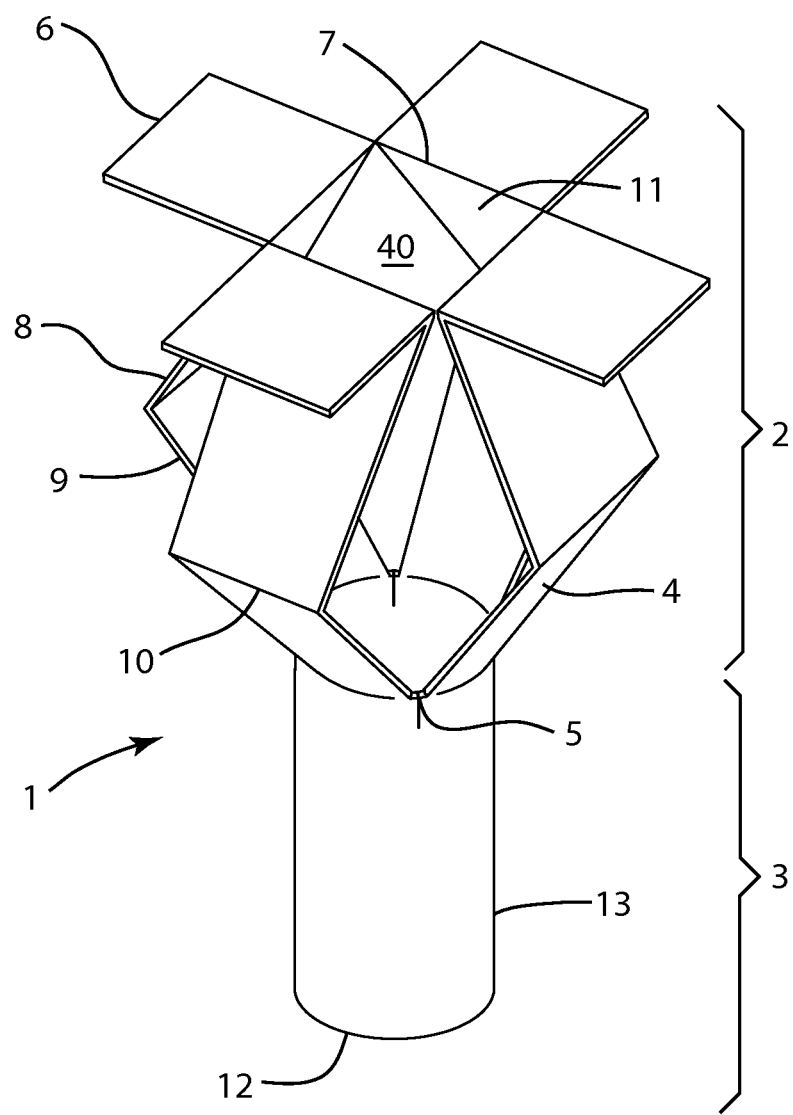
FIG. 1 is a perspective view showing the overall structure of a seed holder for a single crystal silicon seed according to a first embodiment of the present invention.
Figure 7:
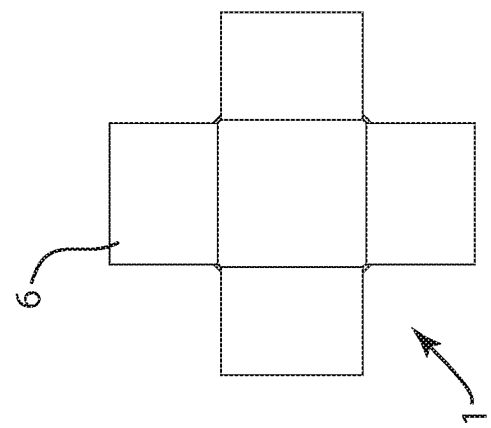
FIG. 7 is a top plan view showing the seed crystal holder with the ends of the strips bent perpendicular to the longitudinal direction of the seed crystal holder.

The entire seed crystal holder 1 can be formed of tantalum (Ta) and is shown in an embodiment in FIG. 1. The body of seed crystal holder 1 includes a strip portion 2 and a base or a base portion 3. The strip portion 2 comprises a plurality of individual strips 4. Each strip 4 has an independent free end not connected to anything and an end opposite the free end joined to the base portion 3 at a terminus or termini of incisions 5 on both sides of each individual strip 4. Incisions 5 terminate in the wall 13 of the base portion 3. Thus the end of the individual strip 4 opposite the free end joins the base portion 3 and becomes integral therewith. Base portion 3 can have a shape including a cylindrical shape, an elliptical tube shape, a rectangular tube shape or a square tube shape, and irregular variations of the aforementioned shapes, among other shapes.

Strips 4 can all have the same or can have shapes different from each other depending on how the material of the strip 4, typically tantalum, is bent or folded. In the embodiment of FIG. 1, each of strips 4 have the same shape. Each free end of each strip 4 is bent perpendicular or approximately perpendicular to the longitudinal direction of the seed crystal holder 1 at a fold line 7 to form a fin or flattened part 6. In the embodiment of FIG. 1, strip 4 contains another fold line 10 (a second fold line) between an upper portion 8 and a lower portion 9 of strip 4. The lower portion 9 joins the base portion 3 of the seed crystal holder 1 at the terminus of incisions 5. In FIG. 1 and the remaining figures, similarly shaped parts all share the same reference numbers, which are not repeated in the figures.

Seed crystal holder 1 has a space or aperture 11 formed by the plurality of strips 4 and an aperture 12 formed in the base portion 3 by the wall 13. The aperture 11 is for the insertion of a silicon seed crystal 24 (FIG. 8) and the aperture 12 can hold the silicon seed crystal 24 if inserted to the base portion 3 as well as provides for flexibility, or deformation, of the seed crystal holder 1 as the base portion 3 is inserted into a chuck (not shown) for holding the seed crystal holder 1 in a furnace. The seed crystal 24 is releasably retained in the seed crystal holder 1. In FIG. 1, the apertures 11 and 12 are disposed on a same axial line with each other. In other words, an axis line can extend through both the apertures 11 and 12. The apertures 11 and 12 can be the same size or have the same diameter as each other or can be of different sizes or diameters.

The seed crystal holder 1 is hollow between the apertures 11 and 12 and has hollow space or hole 40 therebetween. Preferably the apertures 11 and 12 are coaxial with a longitudinal axis of the seed crystal holder 1. In other words the seed crystal holder 1 has hole 40 that extends transversely along the longitudinal axis of the seed crystal holder 1. The hole opens at opposite ends at apertures 11 and 12. It is understood that the diameter of apertures 11 and 12 may be different from each other without departing from the scope of this invention. In fact the diameter of the hole extending through seed crystal holder 1 varies in the seed crystal holder 1, especially at the strip portion 2. It is also possible for the base portion 3 to be tapered to fit into a holding chuck (not shown). Base portion 3 could also have incisions (not shown) starting from aperture 12 which would help base portion 3 to deform to be received into a chuck with a friction or interference fit.

Preferably, the seed crystal 24 is inserted at least 50% of the length of the seed crystal holder 1 starting from the strip portion 2. The seed crystal 24 can be inserted up to 100% of the length of the seed crystal holder 1 starting from the strip portion 2.

The seed crystal 24 can be any suitable seed crystal and is typically a silicon single crystal. The seed crystal 24 can have any suitable transverse cross sectional shape like a cylindrical shape, an elliptical tube shape, a rectangular tube shape, a square tube shape, or irregular variations of the aforementioned shapes, among other shapes. The seed crystal 24 has a size and shape which can fit in to the hole in the seed crystal holder 1 so that seed crystal 24 has a friction fit with a least the strip portion 2 and/or the base portion 3 of seed crystal holder 1. The single crystal 24 extends beyond the end of strip portion 2 and can also extend beyond the end of base portion 3.

The seed crystal holder 1 is made from a single sheet 20 of tantalum or tantalum foil as shown in FIGS. 2-7. First, as show in FIG. 2 the single sheet 20 is cut to the appropriate size to fit the silicon seed crystal and/or a chuck in the FZ apparatus. Next, as shown in FIG. 3, the single sheet 20 is rolled into a cylinder 21, or a cylinder 21 having a roughly cylindrical shape, with longitudinal edges 22 running the length of the single sheet 20 abutting together at a butt joint 23. Alternatively, longitudinal edges 22 can overlap, but in the embodiment of FIG. 3, the longitudinal edges 22 meet at the butt joint 23.

Next, incisions 5 are made in the cylinder 21. Alternatively, incisions 5 can be made sheet 20 before sheet 20 is rolled into the cylinder 21. A plurality of incisions 5 are made depending on the number of strips 4 desired. In the embodiment shown in FIGS. 4-6, four strips 4 are created. However any number of strips, 2, 3, 4, 5, 6, 7, 8, 9, 10, 11, 12, 13, 14, 15, 16, 17, 18, 19, 20 or more strips can be created simply by cutting the cylinder 21 with additional incisions 5. Incisions 5 are made from one end of the cylinder 21 and terminate along the length of the cylinder 21. The incisions 5 create the strip portion 2 and the base portion 3 of the cylinder 21. A length of the incisions 5 can vary depending on a length of the strips 4 desired. In the embodiment of FIG. 1, for example, the incisions 5 are cut about 50% down the length of the cylinder 21 (or seed crystal holder 1). However the length of the incisions 5 can vary to be 20% to 80% of the length of the seed crystal holder 1, for example, 20%, 25%, 30%, 35%, 40%, 45%, 55%, 60%, 65%, 70%, 75% or 80% of the length the seed crystal holder 1.

Figure 5:
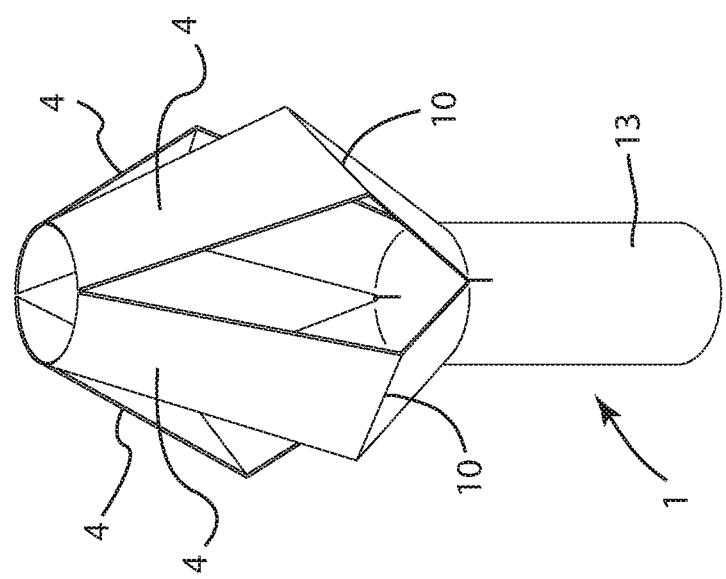
FIG. 5 is a perspective view showing the seed crystal holder in a cylinder shape with the plurality of strips each bent at the base of the strip near the terminus of the incisions and also bent along the length of the strip.

After incisions 5 are cut in cylinder 21, the strips 4 are bent along their length into a desired shape. In FIG. 5, the strips 4 extend from the base portion 3 to a point wider than the base portion 3 until a fold 10 in each of the strips 4 and then extend back toward a center of the seed crystal holder 1.

Figure 6:
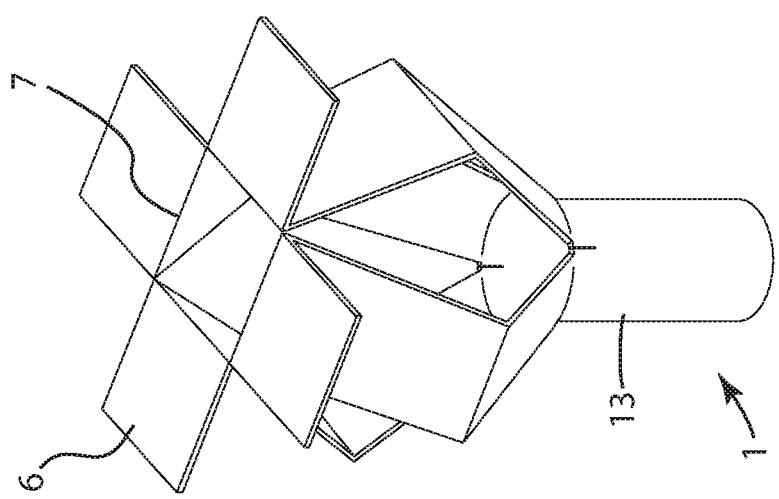
FIG. 6 is a perspective view showing the seed crystal holder of FIG. 5 with the free ends of the strips bent perpendicular to the longitudinal direction of the seed crystal holder.

Finally after shaping strip 4 into the desired shape, the free ends of strip 4 are bent at the fold line 7 perpendicular to the longitudinal direction of the seed crystal holder 1 as shown in FIG. 6 to form the fin or flattened portion 6. This creates a flattened area on the free end of strips 4. The flattened portions 6 of the free ends of the strips 4 can be seen in the top view of seed crystal holder 1 in FIG. 7 in a petal design shape.

Figure 8:
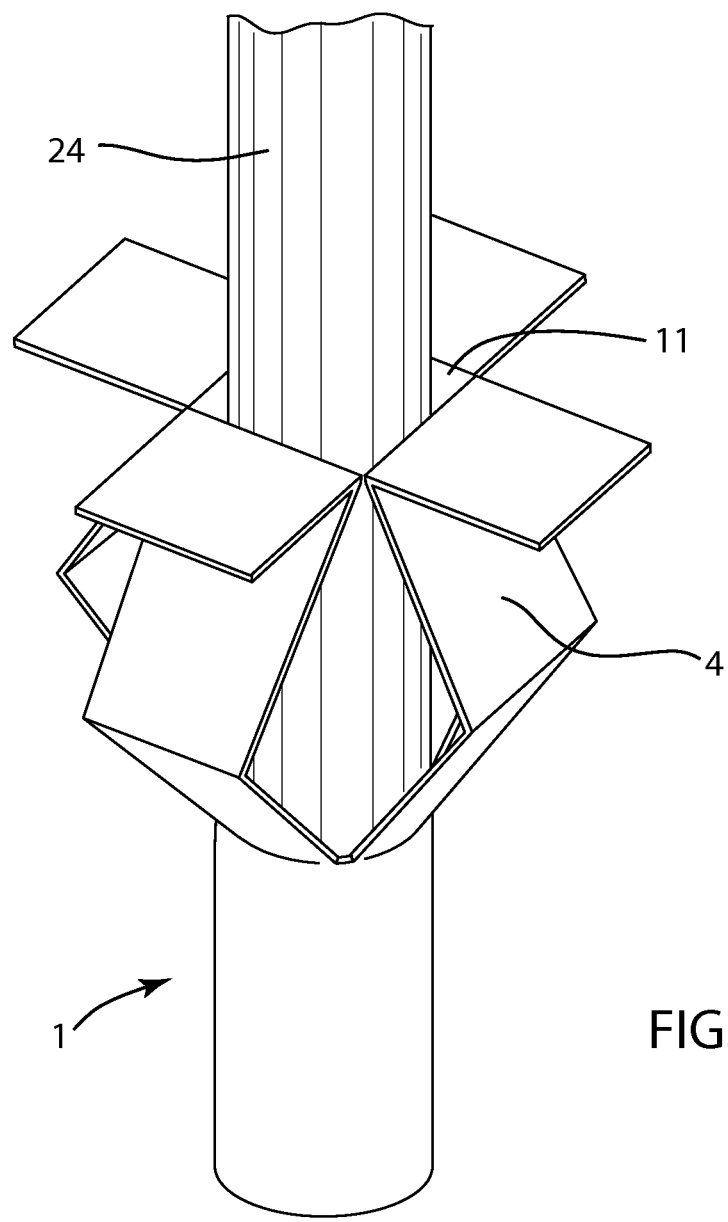
FIG. 8 is a perspective view showing the overall structure of a seed crystal holder with a single crystal silicon seed inserted therein.

FIG. 8 shows the seed crystal holder 1 with seed crystal 24 inserted in aperture 11 among strips 4. Strips 4 are formed to be resilient and to grip various sizes of silicon seeds crystals. Strips 4 are flexible to accommodate wider silicon seeds, wider than the diameter of the base portion 3, as well as narrower than the diameter of the base portion 3. By simply pushing or inserting the seed crystal 24 into the aperture 11, the seed crystal 24 aligns itself automatically with the center line of the seed crystal holder 1. As a result, the time necessary for attaching and removing the seed crystal 24 is greatly reduced.

Furthermore, unlike the prior art, the design of the invention is such that no set screws, latches, catches, pins, clamps or additional holding members are necessary to secure the silicon seed crystal 24 in the aperture 11 among the strips 4. The strips 4 alone can secure seed crystal 24 such that seed crystal 24 is fixed in seed crystal holder 1 and seed crystal 24 will not tip over or dislodge from seed crystal holder 1. The strips 4 act to align and secure seed crystal 24 in the center of seed crystal holder 1.

During crystal growth, load is applied by the weight of the single crystal 24 to the seed crystal holder 1. Load is coaxially transferred to the seed crystal holder 1 and then to the chuck (not shown) into which the seed crystal holder 1 is received. The fact that the strips 4 act to align and secure seed crystal 24 in the center of seed crystal holder 1 establishes a more uniform coaxial load transfer from the seed crystal 24 to the seed crystal holder 1 and then to the chuck (not shown).

The dimensions of the seed crystal holder 1 can vary depending on the size of the silicon seed crystal, the chuck for the seed crystal holder 1, and the desired heating times. For example dimensions of the single sheet 20 as shown in FIG. 2 can be 5 to 22 cm long by 4-10 cm wide. A typical dimension for the single sheet 20 is 6 cm long by 4 cm wide.

The incisions 5 can also be of any length depending on the length of the single sheet 20. In the case of the single sheet 20 being 6 cm long by 4 cm wide, the incisions 5 can be 3 to 4 cm in length of from one end of the cylinder 21.

The incisions 5 can also be spaced apart by any amount depending on the width of the strip 4 desired. For example, in a single sheet 4 cm wide, 3 incisions can be made each about 1.0 cm apart. Thus the seed crystal holder will have 4 strips each about 1.0 cm wide.

The single sheet 20 material is typically tantalum foil and can be of varying thickness. For example, it can be 0.4 mm to 1 mm thick. Typical thickness are in the range of 0.5 mm to 0.8 mm, including 0.6 mm, and preferably 0.7 mm.

The single sheet 20 material can also be made of a tantalum alloy, other metals, metal alloys or other heat conductive materials.

The shape and dimensions of the seed crystal holder 1 can affect heating times of the seed crystal. For example the free ends of the strips 4 with flattened parts 6 can act like a pre-heater to decrease heating time or alternatively in a different design act to increase the heating time of the seed crystal. The design of the invention allows for a much quicker transfer of heat to the single crystal seed. Seed heating is achieved 3 to 4 times faster than prior art heaters. For example, seed crystal in prior art seed crystal holders, purely cylindrical in shape, can take 5 to 6 minutes to heat up thoroughly. However, for the seed crystal holder 1 of the invention, heating times for the seed crystal can be from a little over 1 minute to just 2 minutes. Typical heating times are about 1 minute 30 seconds to 1 minute 40 seconds. The seed crystal holder of the invention also cools down more quickly.

The materials of the seed crystal holder 1 and the seed crystal 24 can be chosen to have similar linear coefficients of thermal expansion. This should reduce the stress on the seed crystal through the temperature cycle during crystal growth. The coefficients of thermal expansion should be maintained for the seed crystal 24 and the seed crystal holder 1 to be within about 50% to 5% total variation from one another, preferably within about 20% total variation, more preferably within about 15%, even more preferably 10% and most preferably within about 5% total variation.

In operation, the seed crystal 24 is rotated during the process of growing the single crystal silicon. However, since the entire periphery of the seed crystal 24 is held by the strips 4, slipping does not occur and the state of core alignment can be maintained.

Figure 10:
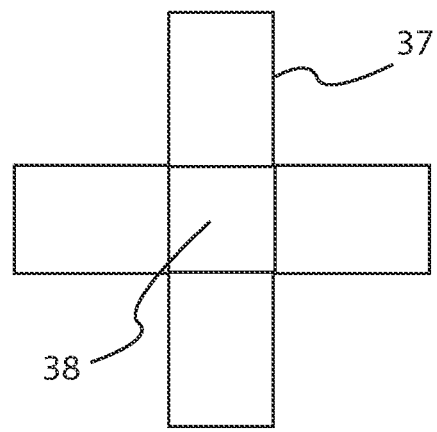
FIG. 10 is a top plan view showing a seed crystal holder of a second embodiment with the ends of the strips bent perpendicular to the longitudinal direction of the seed crystal holder.
Figure 11:
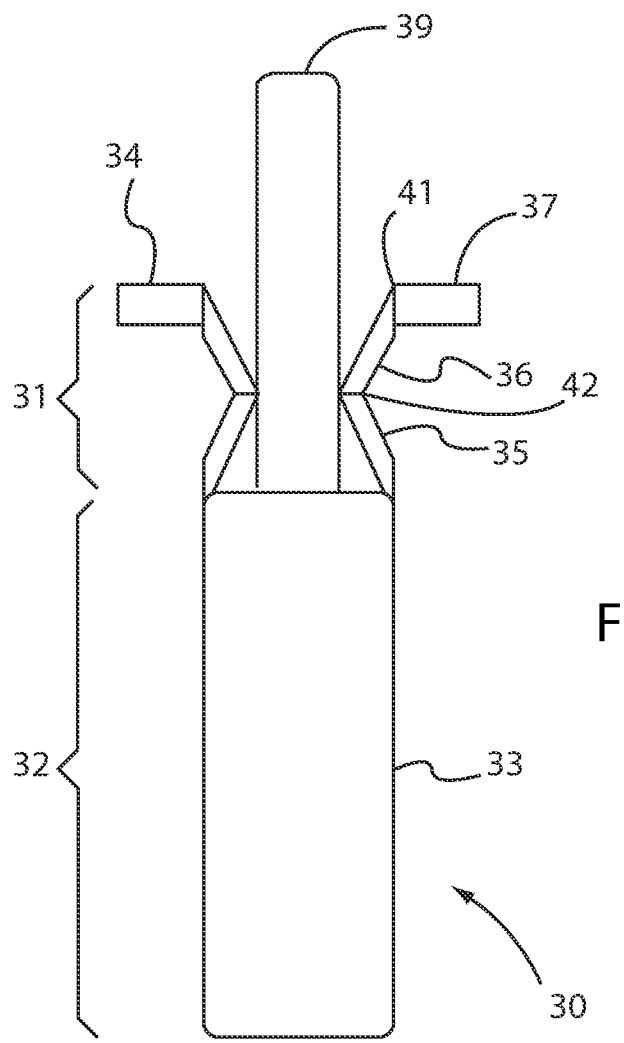
FIG. 11 is a cross-sectional view of the seed crystal holder of the second embodiment showing the seed crystal holder with a single crystal silicon seed inserted in the seed crystal holder.

FIGS. 10 and 11 show a seed crystal holder 30 of a second embodiment. A body of the seed crystal holder 30 includes a strip portion 31 and a base portion 32. Each strip 34 of strip portion 31 has an independent free end not connected to anything and an end opposite the free end joined to the base portion 32.

Base portion 32 can have a shape including a cylindrical shape, an elliptical tube shape, a rectangular tube shape or a square tube shape, and irregular variations of the aforementioned shapes, among other shapes. Base portion 32 includes base 33 which can be the same hollow design as base 3 for the seed crystal holder 1 of the first embodiment or it can be solid or contain windings of material inside, like tantalum material from which the base can be made, for example.

Strips 34 can all have the same shape or can have shapes different from each other depending on how the material of the strip 34, typically tantalum, is bent or folded. In the embodiment of FIGS. 10-11, each of strips 34 have the same shape. Each free end of each strip 34 is bent perpendicular or approximately perpendicular to the longitudinal direction of the seed crystal holder 30 at a fold line 41 to form a fin or flattened part 37. In the embodiment of FIG. 11, strip 34 contains another fold line 42 (a second fold line) between an upper portion 36 and a lower portion 35 of strip 34. The lower portion 35 joins the base portion 33 of the seed crystal holder 30.

Seed crystal holder 30 has a space or aperture 38 formed by the plurality of strips 34. The aperture 38 is for the insertion of a silicon seed crystal 39 and the aperture 38 provides for flexibility, or deformation, of the strips 34. The seed crystal 39 is releasably retained in the seed crystal holder 30.

The configuration of strips 34 of seed crystal holder 30 serve also as an alignment guide when inserting the silicon seed crystal 39, as shown inserted in FIG. 11. The seed crystal 39 will contact the plurality of angled upper portions 36 of the plurality of strips 34 when being inserted into seed crystal holder 30 and as a result will be guided into aperture 38. Because of the symmetry of the strips 34 in the second embodiment, the seed crystal 39 will be automatically aligned with the center line of the seed crystal holder 30 during insertion. As a result, the time necessary for attaching and removing the seed crystal 39 is greatly reduced.

Furthermore for both seed crystal holders 1 and 30 of the first and second embodiments, the seed contact with the base and the configuration of strips contacting the seed crystal provides direct contact with a non-melt zone area of the seed which provides quicker heat transfer to the single crystal seed.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims. The invention and embodiment are described for illustrative, but not limitative purposes. It is to be understood that changes and/or modifications can be made by those skilled in the art without for this departing from the related scope of protection, as defined by the enclosed claims.

What is claimed is:

1. A seed crystal holder comprising:
 a plurality of strips to clamp a seed crystal in the seed crystal holder; and
 a base supporting the plurality of strips.

2. The seed crystal holder of claim 1, wherein the plurality of strips and the base are of unitary construction.

3. The seed crystal holder of claim 1, wherein the plurality of strips are resilient to accommodate and clamp different sized seed crystals therein.

4. The seed crystal holder of claim 1, wherein one end of each of the plurality of strips terminates in the base supporting the plurality of strips becoming integral with the base.

5. The seed crystal holder of claim 1, wherein the base is in a cylinder shape.

6. The seed crystal holder of claim 1, wherein the plurality of strips is four strips and a portion of a free end of each of the strips is bent perpendicular to the longitudinal direction of the seed crystal holder to form a flattened part.

7. The seed crystal holder of claim 1, wherein the seed crystal holder is made of tantalum.

8. The seed crystal holder of claim 1, wherein each of the plurality of strips has at least two folds, one fold being at a portion of a free end at each of the strips and another fold being between the first fold and the other end of the strip which joins the base of the seed crystal holder.

9. A float zone apparatus comprising:
  a crystal growth chamber;
  a seed crystal holder further comprising:
    a plurality of strips to clamp a seed crystal in the seed crystal holder; and
    a base supporting the plurality of strips;
  a polycrystal holder that holds a polycrystalline silicon rod;
  an induction heating coil; and
  a rotating device for rotating the seed crystal holder and the polycrystal holder.

* * * * *